United States Patent
Jung

(10) Patent No.: US 7,112,498 B2
(45) Date of Patent: Sep. 26, 2006

(54) METHODS OF FORMING SILICIDE LAYER OF SEMICONDUCTOR DEVICE

(75) Inventor: Jin Hyo Jung, Bucheon-si (KR)

(73) Assignee: Dongbu Electronics Co., Ltd, Seoul (KR)

( * ) Notice: Subject to any disclaimer, the term of this patent is extended or adjusted under 35 U.S.C. 154(b) by 0 days.

(21) Appl. No.: 11/026,611

(22) Filed: Dec. 30, 2004

(65) Prior Publication Data

US 2005/0142727 A1 Jun. 30, 2005

(30) Foreign Application Priority Data

Dec. 31, 2003 (KR) ............ 10-2003-0101071

(51) Int. Cl.
*H01L 21/336* (2006.01)
(52) U.S. Cl. .............. 438/303; 438/304; 438/649
(58) Field of Classification Search ........ 438/300–308, 438/299–307, 649, 651, 655, 682
See application file for complete search history.

(56) References Cited

U.S. PATENT DOCUMENTS 4,922,311 A * 5/1990 Lee et al. ............. 257/288
6,630,721 B1 10/2003 Ligon
2002/0158280 A1* 10/2002 Shinkawata ............. 257/296
2003/0124844 A1 7/2003 Li et al.
2003/0162349 A1 8/2003 Wieczorek et al.

* cited by examiner

*Primary Examiner*—H. Jey Tsai
(74) *Attorney, Agent, or Firm*—Andrew D. Fortney

(57) ABSTRACT

Methods of forming silicide layers of a semiconductor device are disclosed. A disclosed method comprises depositing a polysilicon layer, a buffer oxide layer, and a buffer nitride layer on a semiconductor substrate; forming a gate on the semiconductor substrate by removing some portion of the polysilicon layer, the buffer oxide layer, and the buffer nitride layer; forming sidewall spacers on the sidewalls of the gate; forming source and drain regions in the semiconductor substrate by performing an ion implantation process; forming a first silicide layer on the source and drain regions; depositing a first ILD layer over the semiconductor substrate including the gate and the first silicide layer; removing some portion of the first ILD layer to expose the top surface of the gate; and forming a second silicide layer on the gate.

20 Claims, 5 Drawing Sheets

METHODS OF FORMING SILICIDE LAYER OF SEMICONDUCTOR DEVICE

FIELD OF THE INVENTION

The present invention generally relates to semiconductor devices and, more particularly, to methods of forming silicide layers of a semiconductor device.

BACKGROUND

As semiconductor devices are highly integrated, the width of a gate and impurity regions that are used as source and drain regions are reduced. Such reduction in width increases the contact resistance of impurity regions as well as the sheet resistance of the gate, thereby deteriorating the operation speed of a device.

To solve these problems, a method of forming interconnects of aluminum alloy or tungsten and a method of forming a silicide layer on a polysilicon gate have been suggested. Particularly, when a silicide layer is formed on a polysilicon gate, another silicide layer may be simultaneously formed on impurity regions to reduce the contact resistance of impurity regions.

As described above, as a design rule for semiconductor devices becomes stricter, high sheet resistance of a gate reduces the operation speed of a device. In order to improve the operation speed of a device, it is necessary to form a gate with low resistance. As an alternative, a method of forming silicide made from heat resistant metal on a gate electrode has been suggested. Such a gate electrode with silicide is known as a polycide (silicide on doped polycrystalline silicon) gate electrode.

The silicide is generally made of $WSi_2$. However, as a semiconductor device is highly integrated and the area of a unit device is reduced, forming sicilice with lower resistance is required. $WSi_2$ has a specific resistance between 60 $\mu\Omega$ cm and 200 $\mu\Omega$ cm. Silicide with low specific resistance includes $CoSi_2$ and $TiSi_2$. $CoSi_2$ and $TiSi_2$ has a specific resistance between 15 $\mu\Omega$ cm and 20 $\mu\Omega$ cm, respectively.

There are two methods of forming a polycide structure. First, a metal layer is deposited on a doped polysilicon layer and heat-treated so that the metal reacts with the polysilicon to form silicide. However, the silicide made of metal and silicon is considerably thick and may not have a uniform thickness. Generally, pure metal violently reacts with silicon to form silicide with rough interface morphology, which makes it difficult to accurately pattern a gate electrode in a later unit process. In addition, uniform silcide may not be formed because of the dopant of high concentration in the polysilicon which reacts with the metal.

Second, a silicide material is directly deposited on a doped polysilicon layer. In detail, a silicide layer is formed on a doped polysilicon layer by a sputtering process using a silicide composite target. However, the method may generate particles during silicide formation. In other words, because in the composite target consisting of metal and silicon the sputtering rate of the metal and the silicon is different each other, non-uniform silicide is formed, thereby generating particles.

FIGS. 1a through 1e are cross-sectional views illustrating a conventional process of forming silicide layers of a semiconductor device.

Referring to FIG. 1a, at least one field oxide layer (not shown) is formed in a semiconductor substrate 10 to define at least one active region by using a device isolation process, for example, local oxidation of silicon (LOCOS). The surface of the semiconductor substrate 10 is then thermally oxidized to form its oxide layer. The oxide layer is used as a gate insulating layer. Next, a polysilicon layer doped with n-type or p-type impurities is deposited on the oxide layer by using a chemical vapor deposition (CVD) process. Instead of the doped polysilicon layer, an undoped polysilicon layer may be deposited on the oxide layer by using a CVD process and then doped with impurities. Some portion of the doped polysilicon layer and the oxide layer is removed by using a photolithography process to form a gate electrode 12 made of polysilicon and a gate insulating layer 11 made of oxide. An impurity ion implantation process is performed for the resulting structure to form low concentration ion-buried layers 13 for lightly doped drains (LDD) in the active region of the semiconductor substrate 10.

Referring to FIG. 1b, an oxide layer 14 is deposited on the semiconductor substrate including the gate electrode 12 by using a CVD process.

Referring to FIG. 1c, an etch-back process is performed for the oxide layer 14 to form spacers 140 on the sidewalls of the gate electrode 12. The etch-back process performs an anisotropic etching until the top surface of the active region and the gate electrode 12 are exposed. Here, the exposed top surface of the gate electrode 12 has the same width with that of the gate electrode 12. Next, an ion implantation process is performed by using the gate electrode 12 and the spacers 140 as a mask to form high concentration ion-buried layers 15 in the active region of the semiconductor substrate 10.

Referring to FIG. 1d, a thermal treatment process is performed to diffuse the impurity ions in the low concentration ion-buried layers 13 and in the high concentration ion-buried layers 15. As a result, source and drain regions 150 with LDD structure 130 are formed in the semiconductor substrate 10. Here, the thermal treatment process for diffusing the impurity ions may be carried out after a later silicide process is performed. Next, a metal layer 16 is deposited on the semiconductor substrate 10 including the gate electrode 12 and the spacers 140. The metal layer 16 is made of a metal capable of forming silicide by reacting with silicon, such as Co, Ti, or W. The metal layer 16 is deposited by using a sputtering process. Then, a rapid thermal annealing process is performed for the resulting structure to form a first silicide layer 160 on the gate electrode and a second silicide layer 161 on the source and drain regions at the same time.

Referring to FIG. 1e, the remaining unreacted metal layer is removed by a dry etching process to complete silicide structure. Next, if the impurity diffusion process of FIG. 1d has not been performed, a thermal treatment process may be carried out to complete source and drain regions.

However, the above-described conventional process of forming silicide layers has a problem that the sheet resistance of a gate increases because the width of a silicide layer formed on a gate is considerably reduced as the line-width of the gate is scaled down to less than a micron unit, thereby deteriorating the reliability of a device.

SUMMARY OF THE INVENTION

Accordingly, the present invention is directed to semiconductor device fabrication methods that substantially obviate one or more problems due to limitations and disadvantages of the related art.

An object of the present invention is to provide a method of obviating an increase in the sheet resistance of a gate due to the reduction of a gate line-width.

To achieve these objects and other advantages and in accordance with the purpose of the invention, as embodied and broadly described herein, the present invention provides a method of forming silicide layers of a semiconductor device, comprising depositing a polysilicon layer, a buffer oxide layer, and a buffer nitride layer on a semiconductor substrate, forming a gate on the semiconductor substrate, forming sidewall spacers on the sidewalls of the gate, forming source and drain regions in the semiconductor substrate by performing an ion implantation process, forming a first silicide layer on the source and drain regions, depositing a first ILD layer over the semiconductor substrate including the gate and the first silicide layer, removing some portion of the first ILD layer to expose the top surface of the gate, forming a second silicide layer on the gate, and depositing a second ILD layer over the semiconductor substrate including the second silicide layer and the first ILD layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2a through 2e are cross-sectional views illustrating an example process of forming silicide layers of a semiconductor device.

Figure 1A:
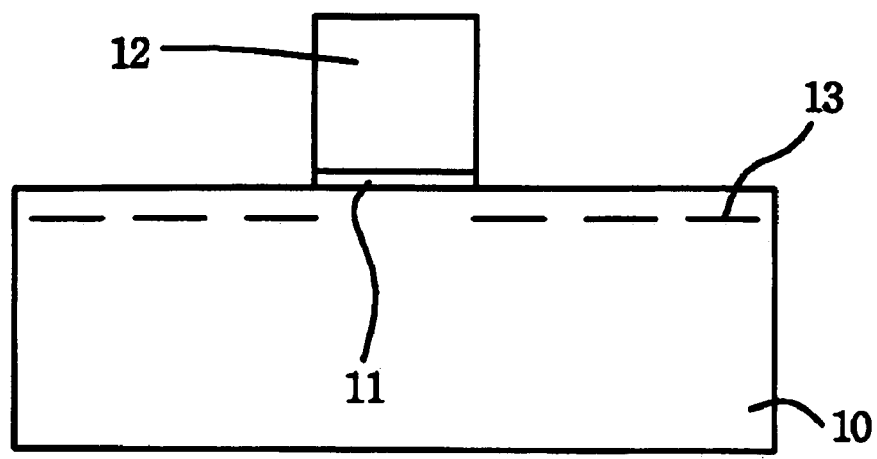
FIGS. 1a through 1e are cross-sectional views illustrating a conventional process of forming silicide layers of a semiconductor device.
Figure 1B:
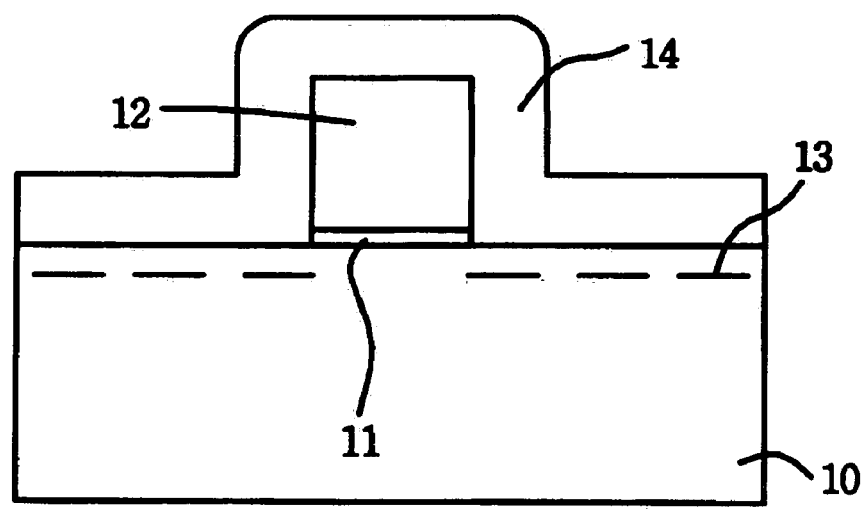
Figure 1C:
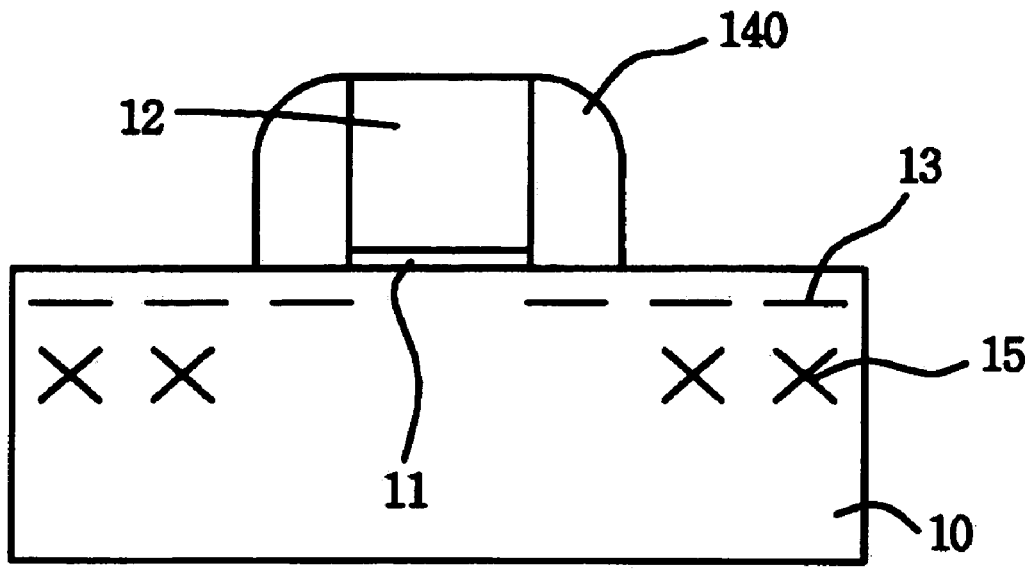
Figure 1D:
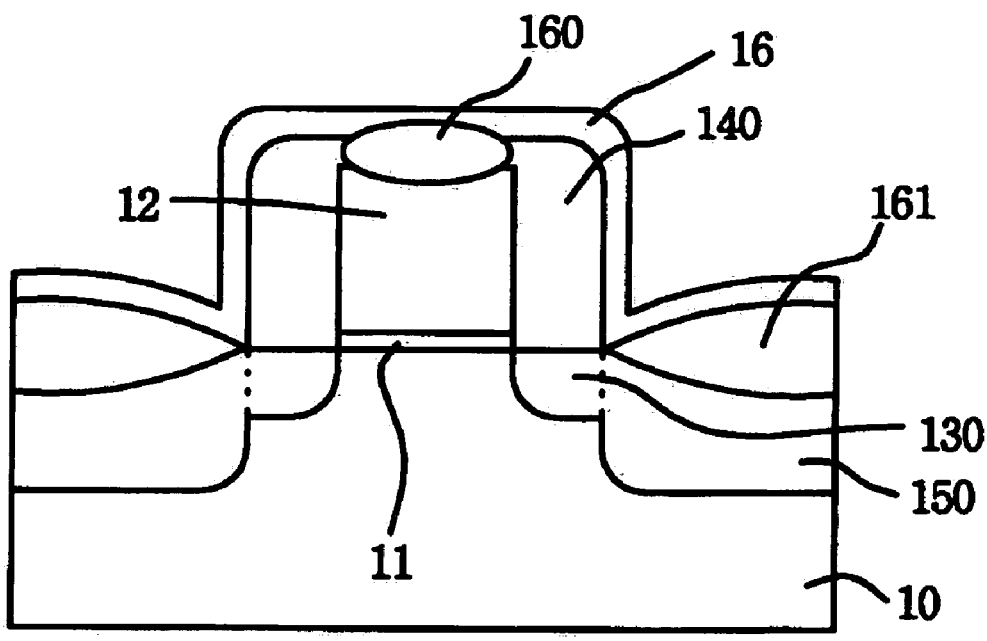
Figure 1E:
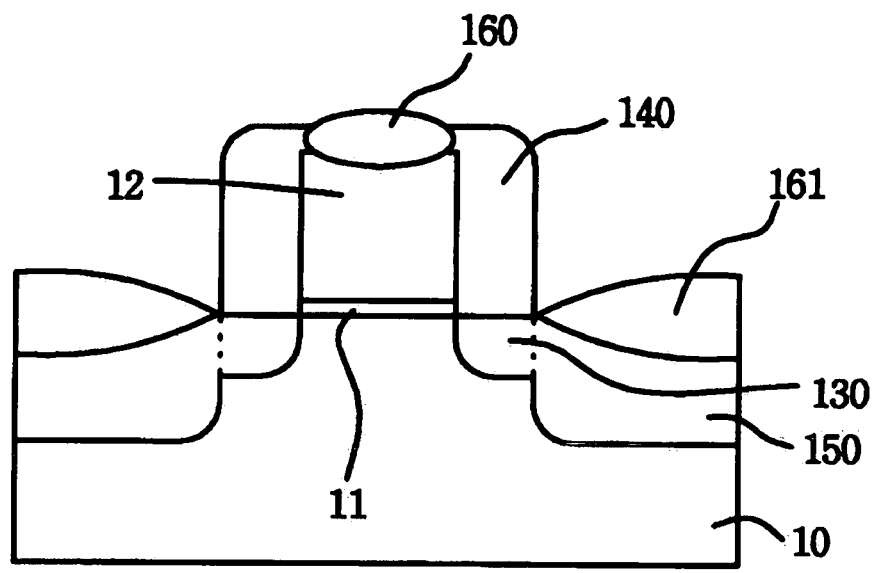
Figure 2A:
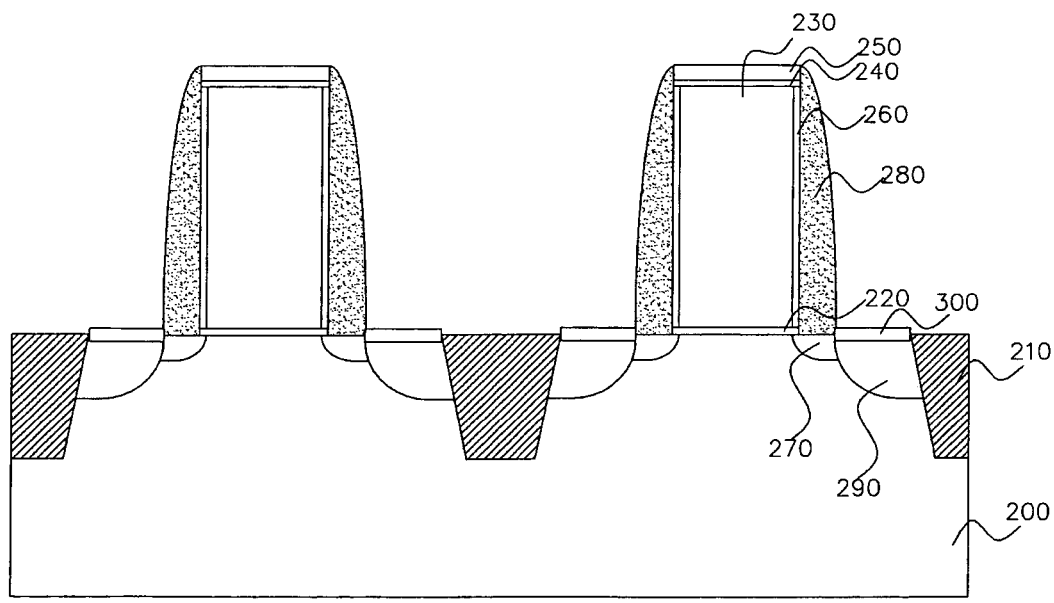
FIGS. 2a through 2e are cross-sectional views illustrating an example process of forming silicide layers of a semiconductor device performed in accordance with the teachings of the present invention.

Referring to FIG. 2a, at least one device isolation layer 210 is formed in a semiconductor substrate 200 by a shallow trench isolation process or a LOCOS process. A gate oxide layer 220 is formed on the semiconductor substrate 200. A polysilicon layer for a gate 230, a buffer oxide layer 240, and a buffer nitride layer 250 are sequentially deposited on the gate oxide layer 220. Some portion of the polysilicon layer, the buffer oxide layer, and the buffer nitride layer is removed to form a gate 230. A polyoxide layer 260 is formed on the sidewalls of the gate 230. An ion implantation process is performed to form LDD structures 270 in the semiconductor substrate 200. After an insulating layer is deposited over the semiconductor substrate including the gate 230 and the polyoxide layer 260, a blanket etching process is performed for the insulating layer to form sidewall spacers 280 on the sidewalls of the gate 230. The insulating layer for the sidewall spacers 280 is preferably formed of oxide, nitride, or a multi-layer of oxide and nitride. Next, an ion implantation process is performed to form source and drain regions 290 in the semiconductor substrate. A silicide process is then carried out to form a silicide layer 300 on the source and drain regions 290. Particularly, a silicide layer is not formed on the gate 230 during the silicide process unlike a conventional MOS transistor process because the buffer oxide layer 240 and the buffer nitride layer 250 are positioned on the gate 230.

Figure 2B:
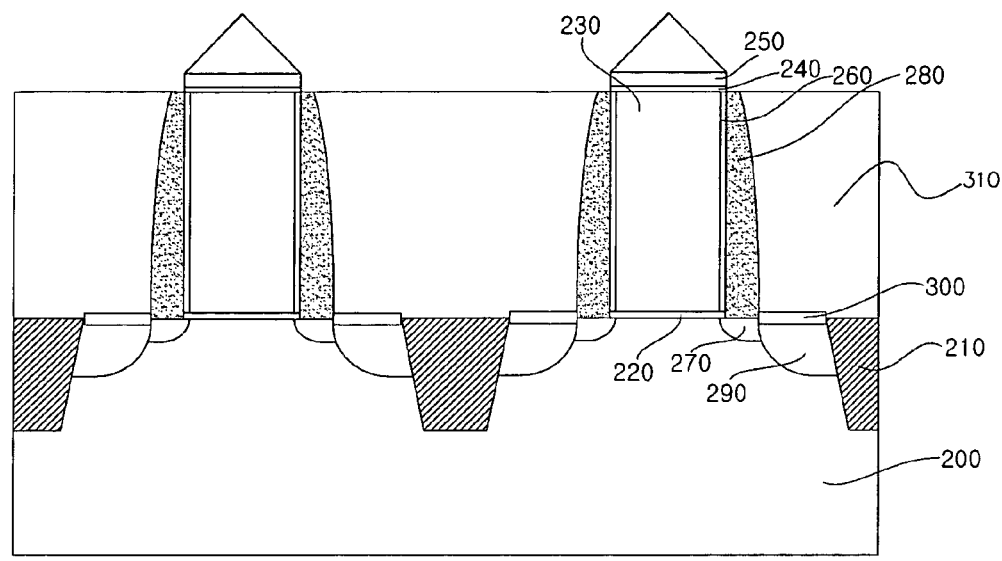

Referring FIG. 2b, a first inter-layer dielectric (ILD) layer 310 is deposited on the structure of FIG. 2a by a high-density plasma chemical vapor deposition (HDP-CVD) process. In another embodiment, an atmospheric pressure chemical vapor deposition (APCVD) process may be used to deposit the first ILD layer 310. The first ILD layer 310 may be formed of boron phosphorus spin-on-glass (BPSG) or phospho-silicate glass (PSG). In the illustrated example process, the thickness of the first ILD layer 310 has to be determined in consideration of a silicide layer to be formed on the sidewalls of the gate 230 by a later unit process because the thickness of the first ILD layer 310 determines the quantity of a silicide layer to be formed on the sidewalls of the gate 230. The first ILD layer 310 is preferably deposited so as to have a height equal to or less than that of the gate.

Figure 2C:
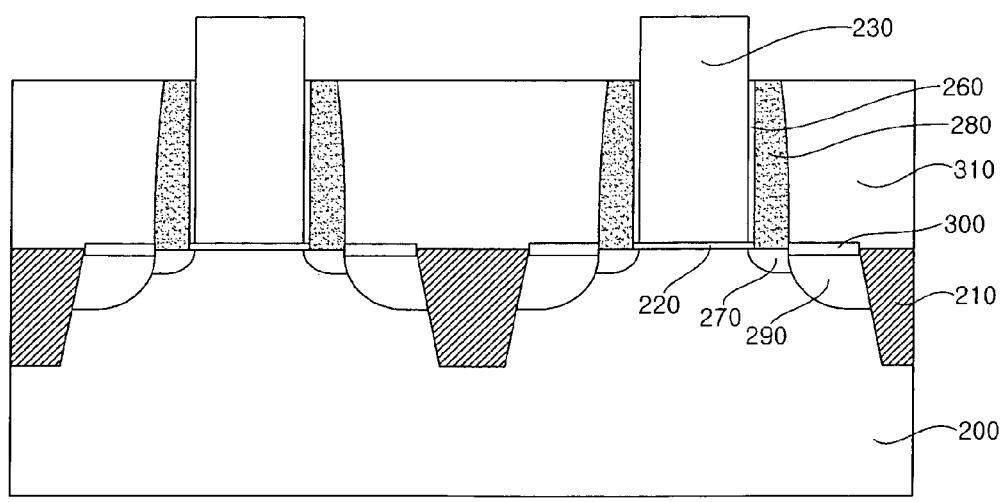

Referring FIG. 2c, some portion of the first ILD layer 310 is removed. In detail, the first ILD layer 310 on the top surface of the gate 230 is removed by using an etch-back process. At the same time, some portion of the first ILD layer 310 and the sidewall spacers 280 on the sidewalls of the gate 230 is also removed. Then, the buffer oxide layer and the nitride layer on the gate 230 are removed by using a wet etching process. The buffer oxide layer and the nitride layer may be removed by using a dry etching process. In the illustrated example process, some portion of the first ILD layer 310 and the sidewall spacers 280 is further removed by the wet or dry etching for removing the buffer oxide layer and the buffer nitride layer so that the sidewalls of the gate 230 is more exposed.

Figure 2D:
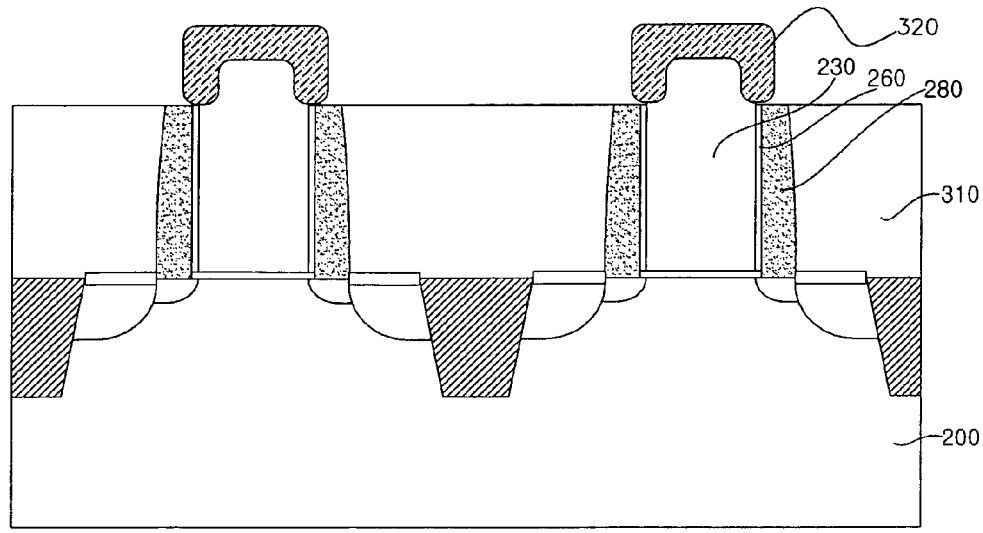

Referring to FIG. 2d, a silicide process is performed to form a silicide layer 320 on the exposed top surface and the sidewalls of the gate 230. By forming the silicide layer 320 on the sidewalls of the gate 230 as well as on the top surface of the gate 230, the illustrated example process can obviate an increase in gate resistance due to the reduction of gate line-width because the silicide on the sidewalls of the gate 230 compensates for the reduced gate line-width. By changing the thickness of the first ILD layer 310, further etching the first ILD layer 310 during the etch-back process, or increasing the period of the wet or dry etching for removing the buffer oxide layer and the buffer nitride layer, the quantity of the silicide formed on the sidewalls of the gate 230 increases and, therefore, the gate resistance can be more lowered.

Figure 2E:
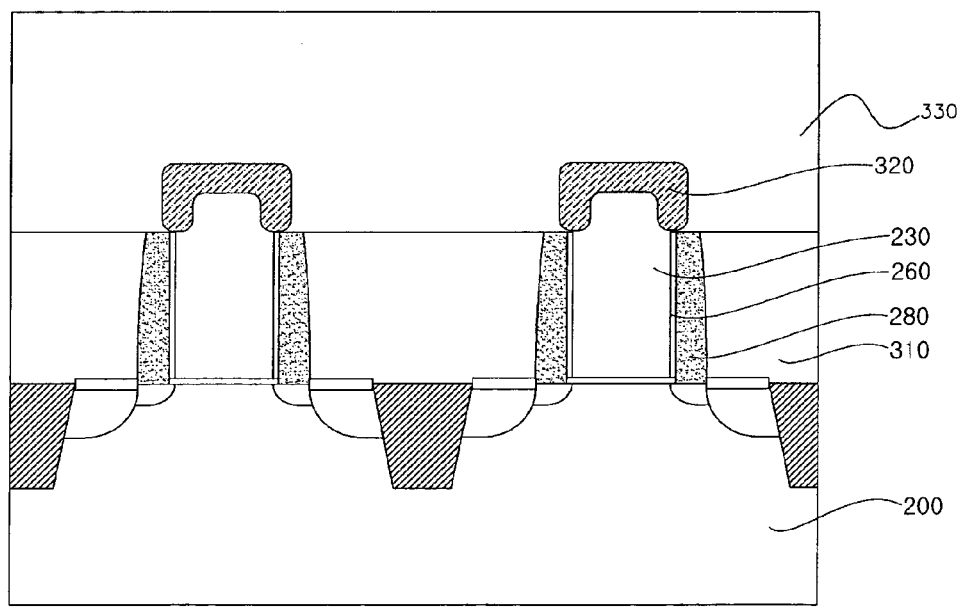

Referring to FIG. 2e, a second ILD layer 330 is deposited on the structure of FIG. 2d. The second ILD layer 330 is preferably formed of the same material with the first ILD layer 310. Sequentially, by performing known fabrication processes, a semiconductor device is completed.

As the junction depth of source and drain regions decreases, a conventional process, which simultaneously forms silicide layers on a gate and on source and drain regions, may cause junction leakage in the source and drain regions when the silicide layers are thickly formed. If the thickness of the silicide layer is reduced, the junction leakage can be prevented but gate resistance may increase. However, the illustrated example process forms a thin silicide layer for source and drain regions and a thick silicide layer for a gate, separately, thereby obviating junction leakage in the source and drain regions and minimizing gate resistance.

From the foregoing, persons of ordinary skill in the art will appreciate that by forming a silicide layer on some portion of the sidewalls of a gate as well as on the top of the gate, the methods disclosed herein can prevent an increase in gate resistance due to reduction of a gate line-width. Further the disclosed fabrication methods can easily change the gate resistance by increasing or decreasing the quantity of silicide formed on the sidewalls of the gate.

It is noted that this patent claims priority from Korean Patent Application Serial Number 10-2003-0101071, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly within the scope of the appended claims either literally or under the doctrine of equivalents.

What is claimed is:

1. A method of forming silicide layers of a semiconductor device comprising:

sequentially depositing a polysilicon layer, a buffer oxide layer, and a buffer nitride layer on a semiconductor substrate;

forming a gate on the semiconductor substrate by removing some portion of the polysilicon layer, the buffer oxide layer, and the buffer nitride layer;

forming sidewall spacers on the sidewalls of the gate;

forming source and drain regions in the semiconductor substrate by performing an ion implantation process;

forming a first silicide layer on the source and drain regions;

depositing a first ILD layer over the semiconductor substrate including the gate and the first silicide layer;

removing some portion of the first ILD layer to expose the top surface of the gate;

forming a second silicide layer that covers the top of the gate and some portion of the sidewalls of the gate; and depositing a second ILD layer over the semiconductor substrate including the second silicide layer and the first ILD layer.

2. A method as defined by claim 1, wherein, following depositing the first ILD layer, the first ILD layer has a height equal to or less than that of the gate.

3. A method as defined by claim 1, wherein removing some portion of the first ILD layer comprises an etch-back process.

4. A method as defined by claim 1, wherein removing some portion of the first ILD layer is performed in consideration of the quantity of the silicide layer to be formed on the sidewalls of the gate by a later unit process.

5. A method as defined by claim 1, further comprising removing the buffer oxide layer and the nitride layer on the gate after removing some portion of the first ILD layer.

6. A method as defined by claim 1, wherein the second silicide layer formed on the gate has a thickness different from that of the first silicide layer formed on the source and drain regions.

7. A method as defined by claim 1, wherein depositing the first ILD layer comprises high-density plasma chemical vapor deposition (HDP-CVD).

8. A method as defined by claim 1, wherein depositing the first ILD layer comprises atmospheric pressure plasma chemical vapor deposition (APCVD).

9. A method as defined by claim 1, wherein the first ILD layer comprises a boron phosphorus spin-on-glass.

10. A method as defined by claim 1, wherein the first ILD layer comprises BPSG.

11. A method as defined by claim 1, wherein the first ILD layer comprises phosphosilicate glass (PSG).

12. A method as defined by claim 1, wherein removing the portion of the sidewall spacers comprises an etch-back process.

13. A method as defined by claim 1, wherein removing the buffer oxide layer and the nitride layer comprises a wet etching process.

14. A method as defined by claim 1, wherein removing the buffer oxide layer and the nitride layer comprises a dry etching process.

15. A method as defined by claim 3, wherein further removing the first ILD layer and the sidewall spacers comprises a wet etching process.

16. A method as defined by claim 3, wherein further removing the first ILD layer and the sidewall spacers comprises a dry etching process.

17. A method as defined by claim 1, wherein the second ILD layer comprises boron phosphorus spin-on-glass.

18. A method as defined by claim 1, wherein the second ILD layer comprises BPSG.

19. A method as defined by claim 1, wherein the second ILD layer comprises phosphosilicate glass (PSG).

20. A method as defined by claim 1, wherein removing some portion of the first ILD layer further exposes a portion of the sidewalls of the gate.

* * * * *